United States Patent
Sanghani

(10) Patent No.: US 6,816,991 B2
(45) Date of Patent: Nov. 9, 2004

(54) BUILT-IN SELF-TESTING FOR DOUBLE DATA RATE INPUT/OUTPUT

(75) Inventor: Amit Dinesh Sanghani, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 393 days.

(21) Appl. No.: 09/996,866

(22) Filed: Nov. 27, 2001

(65) Prior Publication Data

US 2003/0101376 A1 May 29, 2003

(51) Int. Cl.[7] .............................................. G01R 31/28
(52) U.S. Cl. ...................................... 714/733; 713/724
(58) Field of Search ............................... 714/733, 724, 714/729, 712, 744; 340/146.2; 365/225.7; 702/132

(56) References Cited

U.S. PATENT DOCUMENTS

| | | | | |
|---|---|---|---|---|
| 5,023,590 A | * | 6/1991 | Johnson et al. | 340/146.2 |
| 5,349,587 A | * | 9/1994 | Nadeau-Dostie et al. | 714/729 |
| 6,545,927 B2 | * | 4/2003 | Muller | 365/225.7 |
| 6,574,758 B1 | * | 6/2003 | Eccles | 714/712 |
| 6,662,136 B2 | * | 12/2003 | Lamb et al. | 702/132 |
| 6,691,272 B2 | * | 2/2004 | Azim | 714/744 |

* cited by examiner

*Primary Examiner*—David Ton
(74) *Attorney, Agent, or Firm*—Park, Vaughan & Fleming LLP

(57) ABSTRACT

Macro cells for a Double Data Rate (DDR) I/O interface are provided. The macro cells feature built-in self-test (BIST) functionality for testing the I/O interface at speed, without using external test or evaluation equipment. Each input or output macro cell is configured to generate test signals that are submitted to and processed by the I/O interface. The test signals are then dynamically compared to the signals produced by the interface in response to the test signals and a result is generated. The result may comprise an error signal if the test and response signals do not correspond. An I/O BIST controller may be employed to control the initiation and operation of the macro cells' self-testing.

25 Claims, 12 Drawing Sheets

LINEAR FEEDBACK SHIFT REGISTER
200

DDR OUTPUT MACRO CELL 300

DDR OUTPUT MACRO CELL 300

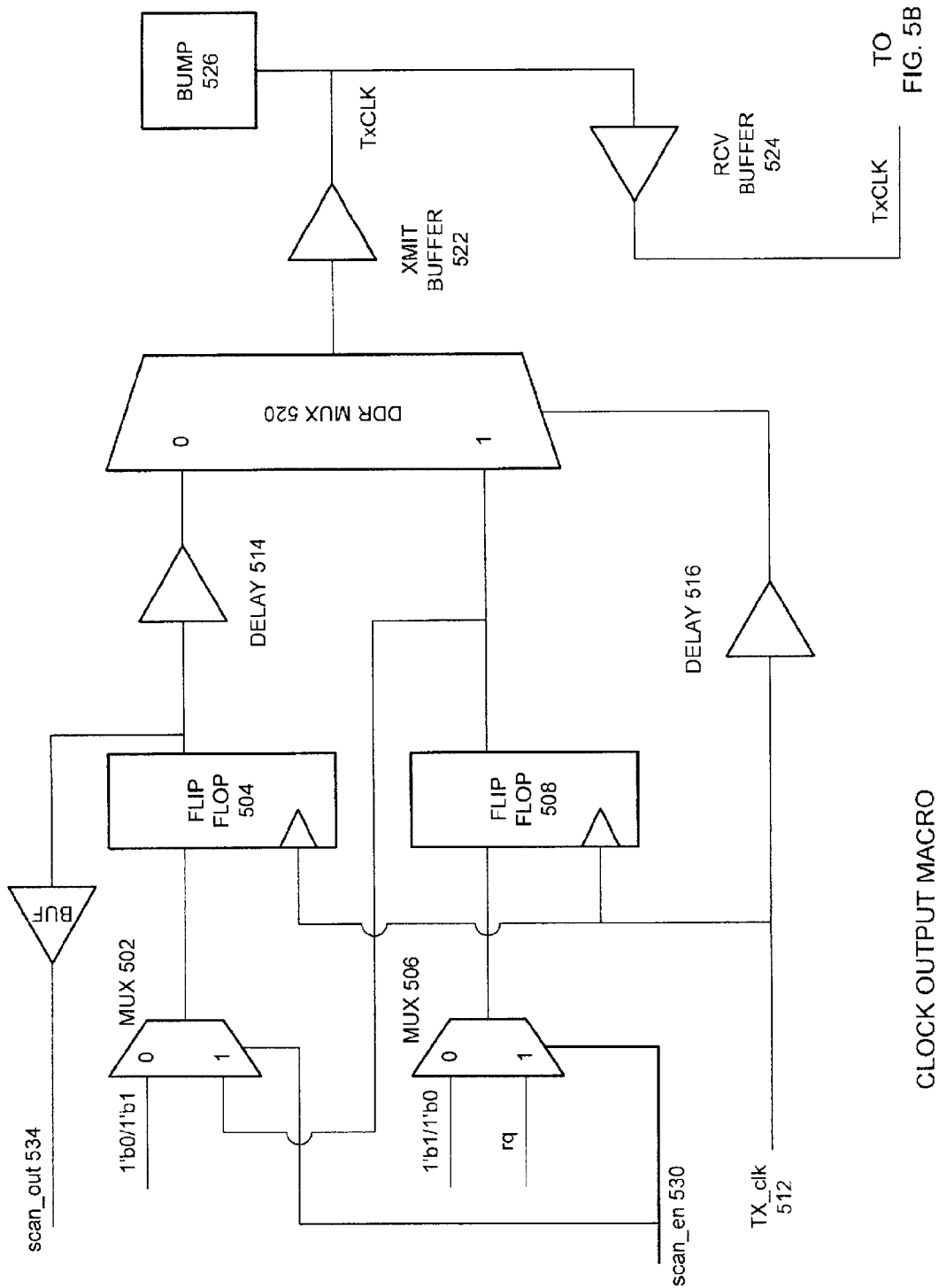

DDR INPUT MACRO CELL 600

BUILT-IN SELF-TESTING FOR DOUBLE DATA RATE INPUT/OUTPUT

BACKGROUND

This invention relates to the field of computer systems. More particularly, a system and methods are provided for facilitating built-in self-testing of a double data rate circuit.

Integrated circuits are generally subjected to rigorous testing (e.g., structural, manufacturing, operational) in order to ensure their correct operation. Conventional testing equipment has usually been adequate to test input/output circuits and interfaces at their designed operating speeds.

However, the operational data rates of newer input/output circuits and interfaces are increasing ever higher. In particular, communication rates have significantly increased with the advent of double data rate (DDR) techniques. As a result, conventional testing equipment and techniques are now inadequate for testing circuits and interfaces that use DDR, particularly at their designed or intended operating rates. Thus, while traditional input/output circuits could be connected to external equipment to test their interfaces, DDR circuits operate too fast for traditional equipment, thereby necessitating specialized and expensive testing equipment. As the number of integrated circuits that employ DDR increase, this problem will become ever more apparent.

In addition, requiring external equipment for testing input/output circuits limits the flexibility of such testing. For example, once an integrated circuit that is configured for testing with external equipment is installed in a device, regular testing of the circuit becomes infeasible.

SUMMARY

Thus, in one embodiment of the invention, an apparatus and method are provided for self-testing a DDR input/output (I/O) circuit or interface at its operating speed. Illustratively, the apparatus may comprise a macro cell with built-in self-test (BIST) logic. A multi-line I/O interface for an integrated circuit (IC) may be constructed using a plurality of these cells, with the whole interface being self-testable. Greater flexibility is afforded the interface design than would be possible if the interface required external equipment for testing.

In another embodiment of the invention, one type of macro cell may be implemented for self-testing the input logic or circuitry of a DDR interface, another type for self-testing the output. Yet another type of macro cell may be implemented for self-testing a clock used for the DDR input and/or output.

A BIST controller is also provided for an I/O interface (e.g., of an application specific integrated circuit) built using the macro cells of an embodiment of the invention. In this embodiment, a relatively slow JTAG controller (according to IEEE 1149.1) may initiate self-testing through the BIST controller, which would operate at the I/O speed of the interface. Illustratively, the IEEE 1149.1 tap collects the final BIST results.

DESCRIPTION OF THE FIGURES

FIGS. 5A–B comprise a self-testable clock output macro cell, in accordance with an embodiment of the invention.

DETAILED DESCRIPTION

Figure 1A:
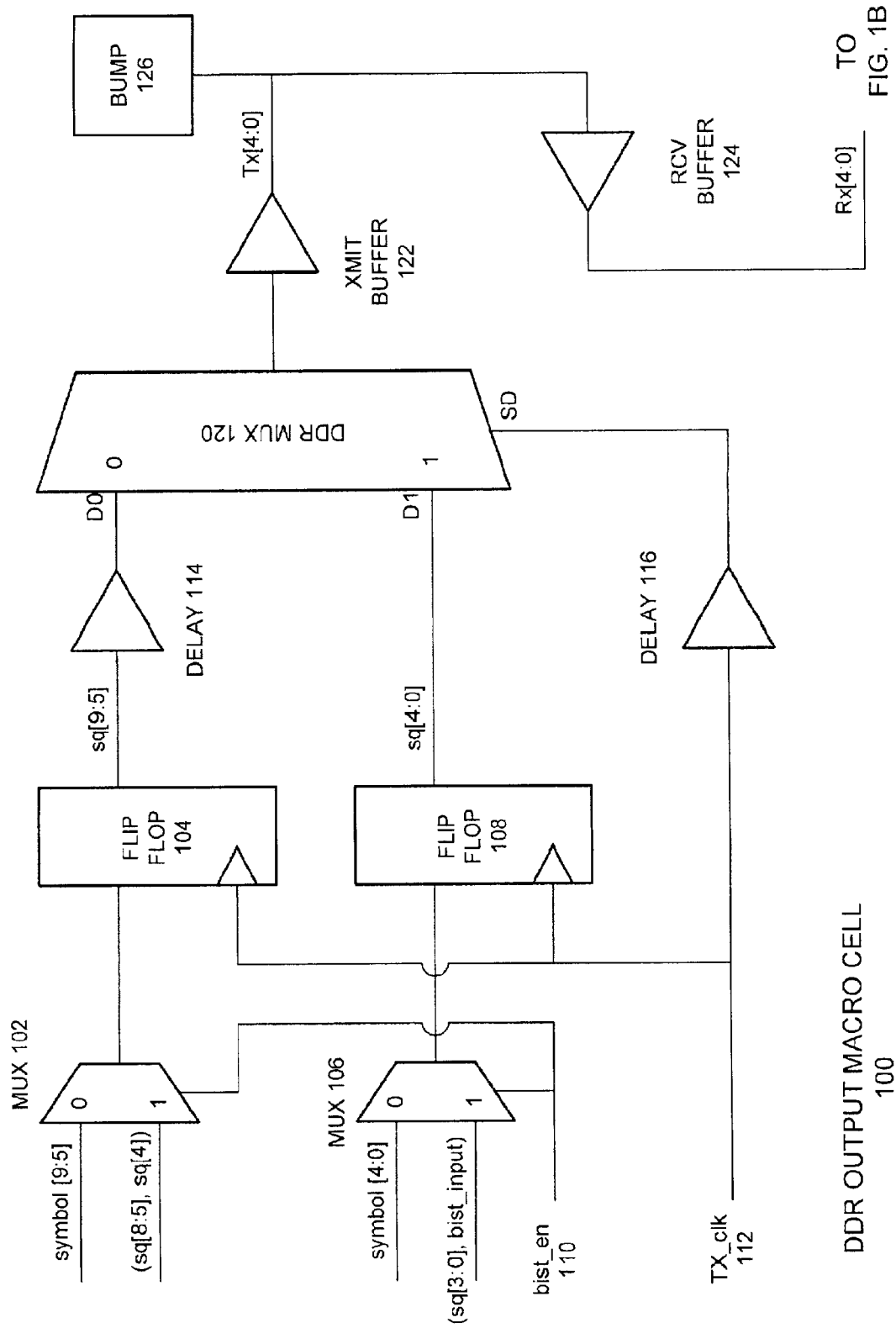
FIGS. 1A–B depict a self-testable Double Data Rate (DDR) output macro cell, in accordance with an embodiment of the present invention.

The following description is presented to enable any person skilled in the art to make and use the invention, and is provided in the context of particular applications of the invention and their requirements. Various modifications to the disclosed embodiments will be readily apparent to those skilled in the art and the general principles defined herein may be applied to other embodiments and applications without departing from the scope of the present invention. Thus, the present invention is not intended to be limited to the embodiments shown, but is to be accorded the widest scope consistent with the principles and features disclosed herein.

The program environment in which a present embodiment of the invention is executed illustratively incorporates a general-purpose computer or a special purpose device such as a hand-held computer. Details of such devices (e.g., processor, memory, data storage, display) may be omitted for the sake of clarity.

It should also be understood that the techniques of the present invention may be implemented using a variety of technologies. For example, methods described herein may be implemented in hardware utilizing either a combination of microprocessors or other specially designed application specific integrated circuits, programmable logic devices, or various combinations thereof.

As one skilled in the art will appreciate, BIST (built-in self-testing) techniques have generally been applied only to the internal logic of an integrated circuit (IC), and have not been used for I/O (input/output) interfaces, particularly to test DDR (double data rate) interfaces operating at their intended data rates. Embodiments of the invention described herein provide such built-in self-testability. The use of a DDR I/O interface that is self-testable eliminates the need for specialized external testing equipment. Such equipment has become increasingly expensive as manufacturers strive to support DDR waveforms and match the operating rates of the interfaces.

In an embodiment of the invention, a macro cell is provided for a DDR I/O interface (e.g., for an integrated circuit). The macro cell provides built-in self-testability, operable at the normal data rate of the interface, and may be combined with similar cells to form an I/O interface of suitable size. In this embodiment, one type of macro cell may be designed and implemented for the transmit portion of the interface, and another cell for the receive portion. Yet another type of cell may be implemented to provide self-testability for a clock supporting either or both of the transmit and receive portions.

One embodiment of the invention described below is compatible with InfiniBand communications and is configured to provide a source synchronous DDR interface operating at a clock rate of approximately 250 MHz. Other embodiments of the invention that are described herein or that may be derived from the following description may be suitable for interfaces operating at different clock speeds—such as a 312.5 MHz interface for 10 Gbps source synchronous Ethernet or a 150 MHz interface for synchronous SRAM DDR.

DDR I/O techniques effectively double the bandwidth of a communication connection by transferring data at every edge of a clock signal (rising and falling) rather than on just one edge as with traditional data transfer techniques. However, along with increasing the bandwidth of a connection, DDR I/O also complicates the design of the communication interface and the testing of the interface. In particular, the design and testing must support the increased bandwidth and handle twice the number of data transfers.

A BIST-capable macro cell for a DDR I/O interface according to one embodiment of the invention provides the following desirable testing procedures. It creates appropriate stimuli (e.g., signal patterns) in DDR form, evaluates the behavior of the interface (e.g., analyzes the interface's response to the stimuli) and generates diagnostics or produces a result to indicate whether the interface is operating correctly. In contrast, current methods of testing DDR I/O interfaces require external equipment, and one or more of these steps (stimulus creation, response evaluation, result generation) are performed outside of the integrated circuit or interface that is being tested.

DDR Data Transmit Macro Cell

In one embodiment of the invention, a DDR output macro cell with built-in self-testability is provided. The output macro cell may be combined with like cells to form a DDR I/O interface of a desired size. The macro cell includes a pattern generator for generating test DDR signals, an evaluator to determine whether the interface handled or processed the signals correctly and a result generator to signal an error if a test signal is corrupted or handled improperly. As described above, this design includes BIST logic to allow the DDR I/O interface to be tested internally.

Figure 1B:
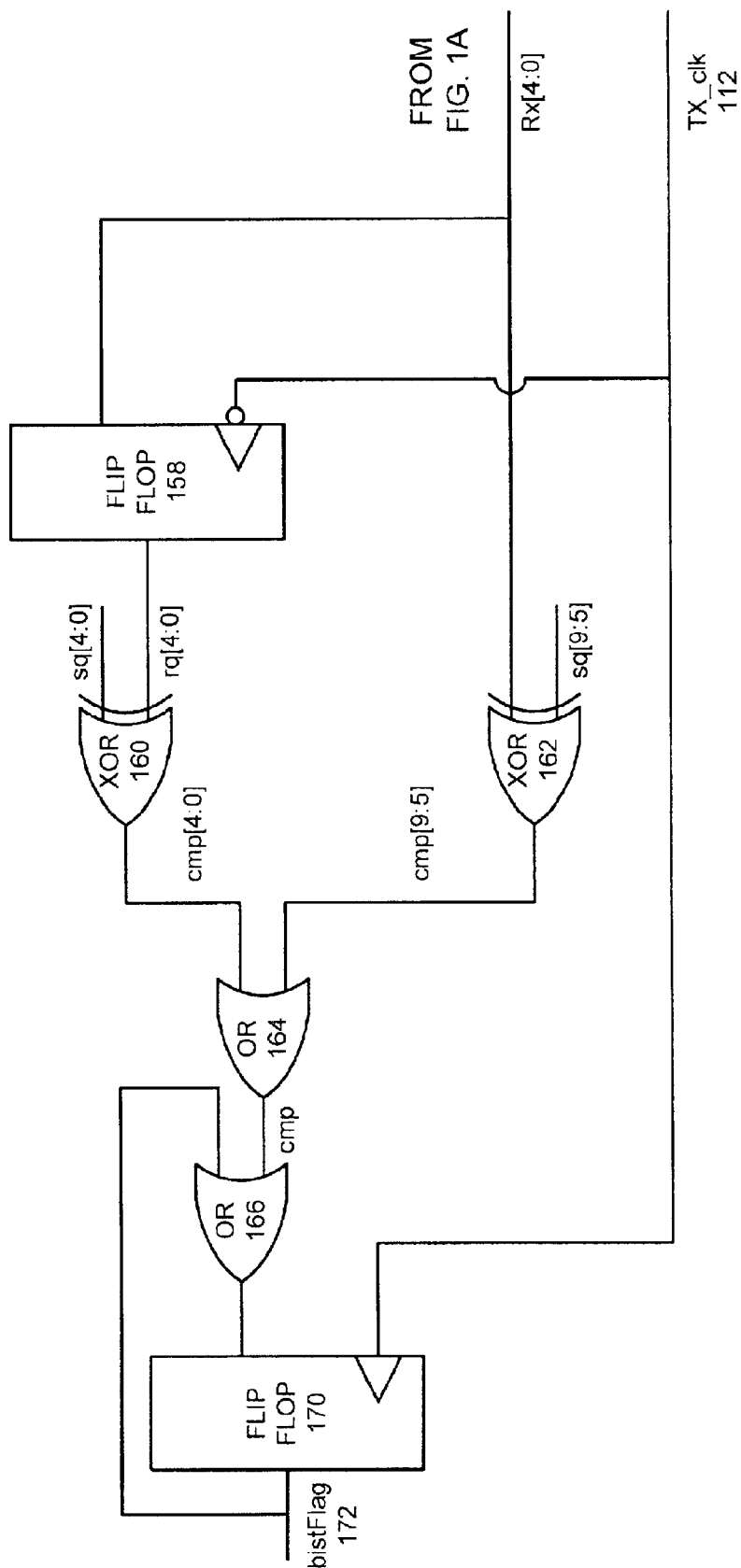

FIGS. 1A–B demonstrate an illustrative DDR output macro cell 100 configured according to one embodiment of the invention. FIG. 1A depicts illustrative circuitry for transmitting DDR data. FIG. 1B depicts illustrative logic for evaluating the performance of the circuitry of FIG. 1A in this embodiment of the invention. Logic or circuitry having similar design and/or functionality could be derived from FIGS. 1A–B and the following discussion without exceeding the scope of the invention. In particular, the DDR transmission circuitry to be tested may differ from that depicted in FIG. 1A, in which case the evaluation logic of FIG. 1B may be altered accordingly.

Also, circuit elements in FIGS. 1A–B and other figures may be simplified for clarity. For example, reset lines for flip-flops and/or other known elements may be omitted. And, where one flip-flop, signal line or other component may be depicted to represent multiple similar or identical components, one skilled in the art will readily apprehend how to implement the invention from the figures and accompanying descriptions.

A DDR I/O interface assembled from macro cell 100 may be configured to receive ten lines of input or BIST signal patterns, which are multiplexed into DDR waveform and transmitted externally over five lines. More particularly, in the illustrated embodiment, multiplexer 102 receives five data input lines for flip-flop 104, while multiplexer 106 receives another five input lines for flip-flop 108. The multiplexers select between the functional data and BIST signal patterns depending on the status of bist_en signal 110, which is raised when BIST is activated and remains high as long as BIST continues. During BIST, test signals are passed through the output logic and then evaluated to determine whether they were processed correctly. When BIST is inactive (e.g., during a normal mode of operation) and therefore bist_en is low, multiplexers 102, 106 pass outgoing data to the flip-flops. The timing of the flip-flops and DDR multiplexer 120 is controlled by TX_clk 112.

By delaying the output of flip-flop 104 (with delay 114), DDR multiplexer 120 receives a steady stream of input, alternating between flip-flops 104 and 108, for producing appropriate DDR output, which is transmitted through transmit buffer 122 and bump 126. Multiplexer 120 transmits data at twice the rate of multiplexers 102 and 106, and can therefore merge their data feeds into a single DDR stream. In this embodiment, delay 116 is less than delay 114 in order to meet the necessary hold time of flip-flop 104.

Receive buffer 124 is included in macro cell 100 to allow the DDR output to be routed to the evaluation circuitry of FIG. 1B for comparison with the original test DDR signal patterns. Transmit buffer 122, receive buffer 124 and bump 126 may, collectively, comprise bi-directional High-Speed Transceiver Logic (HSTL BIDI).

Figure 2:
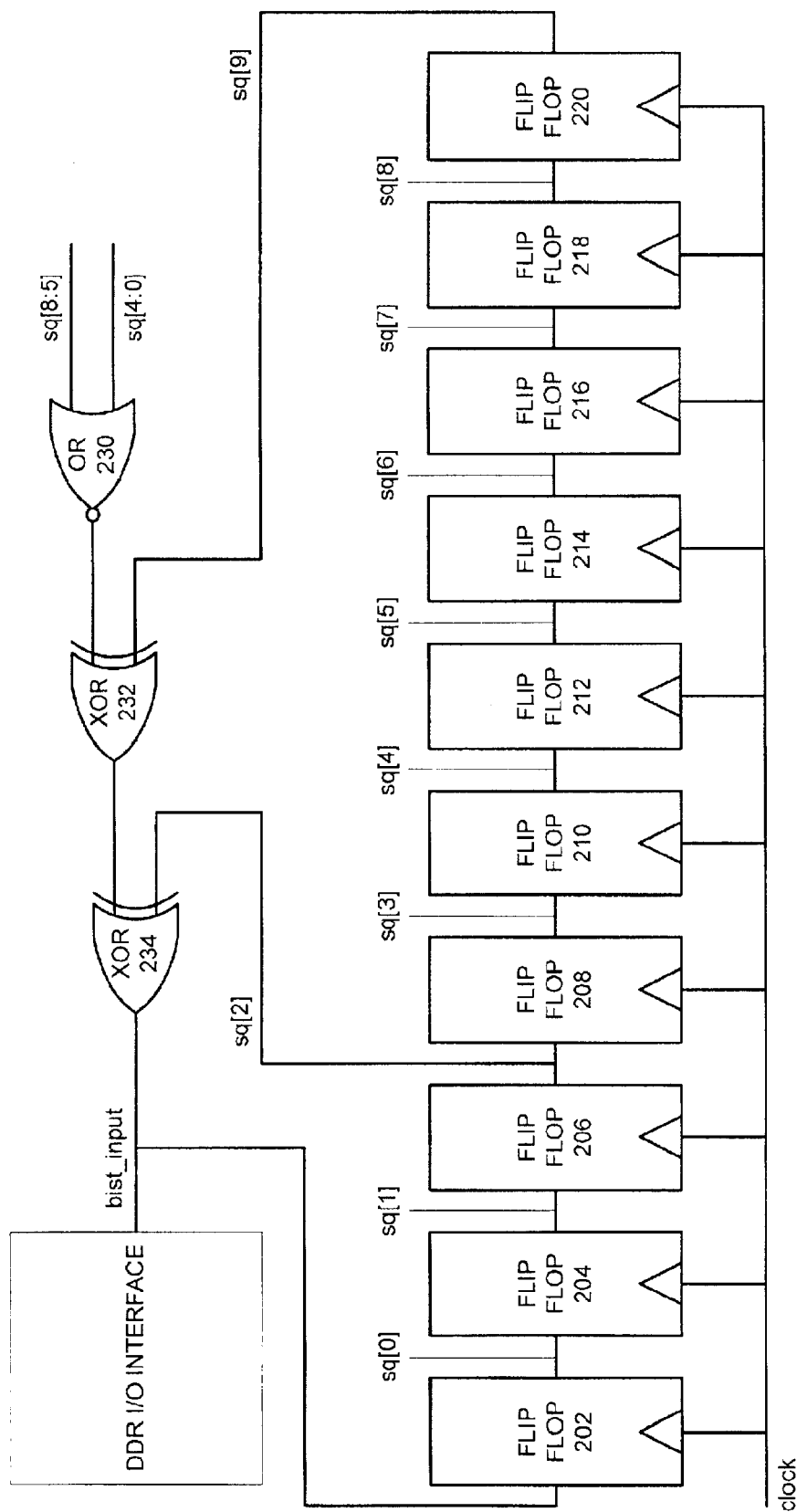
FIG. 2 demonstrates a linear feedback shift register for generating DDR signal patterns, in accordance with an embodiment of the invention.

In this embodiment of the invention, a linear feedback shift register (LFSR) is employed to generate DDR patterns for testing the DDR output logic. FIG. 2 demonstrates one suitable LFSR 200, having the characteristic polynomial of $x^{10}+x^3+1$, which may be included in a DDR output macro cell such as cell 100. This polynomial generates 1023 unique patterns and the feedback logic may be modified to generate a total of 1024 patterns by starting with an appropriate seed (e.g., zero). Test patterns produced by LFSR 200 are applied to the DDR I/O interface (e.g., macro cell 100 of FIG. 1A) and then received at the evaluation/result circuitry of FIG. 1B, through receive buffer 124, for comparison and error generation.

In this embodiment of the invention, the LFSR that generates the test DDR signals may comprise elements of the DDR I/O circuit being tested. Thus, flip-flop 104 of FIG. 1A may correspond to or comprise flip-flops 202, 204, 206, 208 and 210 of FIG. 2, while flip-flop 108 represents or comprises flip-flops 212, 214, 216, 218 and 220. The implementation of LFSR 200 within output macro cell 100 thus facilitates the assembly of a DDR I/O that is completely self-testable. In alternative embodiments of the invention, means other than an LFSR may be employed to generate test patterns. For example, test patterns may be supplied or generated by counters, shifters, encoders or other means. These alternative stimuli providers may require additional logic.

Returning now to FIG. 1B, one phase portion of the receive stream is processed or qualified through flip-flop 158 on the falling edge of the clock. The remainder (e.g., the other phase) passes directly to XOR 162. The XOR gates thus compare the test signals (i.e., the stimuli) to the response produced by DDR multiplexer 120. In particular, XOR gate 160 compares the output of flip-flop 108 (or, alternatively, the data fed to flip-flop 108) with the corresponding portion of the DDR output produced by DDR multiplexer 120, while XOR gate 162 compares the output of flip-flop 104 (or, alternatively, the data fed to flip-flop 104) with the corresponding portion of the DDR output.

If the transmission circuitry of the I/O interface is operating correctly, the evaluation logic (e.g., XOR gates 160, 162) should remain low. Otherwise, if an error is detected, OR gates 164, 166 carry a high signal to result flip-flop 170, which raises bistFlag 172 to indicate an error and feeds this signal back to OR gate 166 to retain the error. It may be seen that macro cell 100 evaluates the DDR output in real-time, as it is fed to the evaluation logic of FIG. 1B. More specifically, the DDR output is not stored for later comparison.

In one embodiment of the invention, the result produced by flip-flop 170 is fed to an I/O BIST controller, which can be programmed to halt on an error. In this embodiment, the state of the LFSR can be read when an error occurs and the signal pattern that caused the failure can be determined. This promotes effective diagnostic capability.

In DDR macro cell 100, the following path relationships may be established and maintained in order to provide for sufficient setup time on D1 of DDR multiplexer 120 relative to SD, and sufficient hold time on D0 relative to SD. TX_clk 112 through D0 of DDR multiplexer 120 to bump 126 may be greater than TX_clk 112 through SD of the DDR multiplexer to the bump, which may be greater than TX_clk 112 through D1 of the DDR multiplexer to the bump.

Figure 3A:
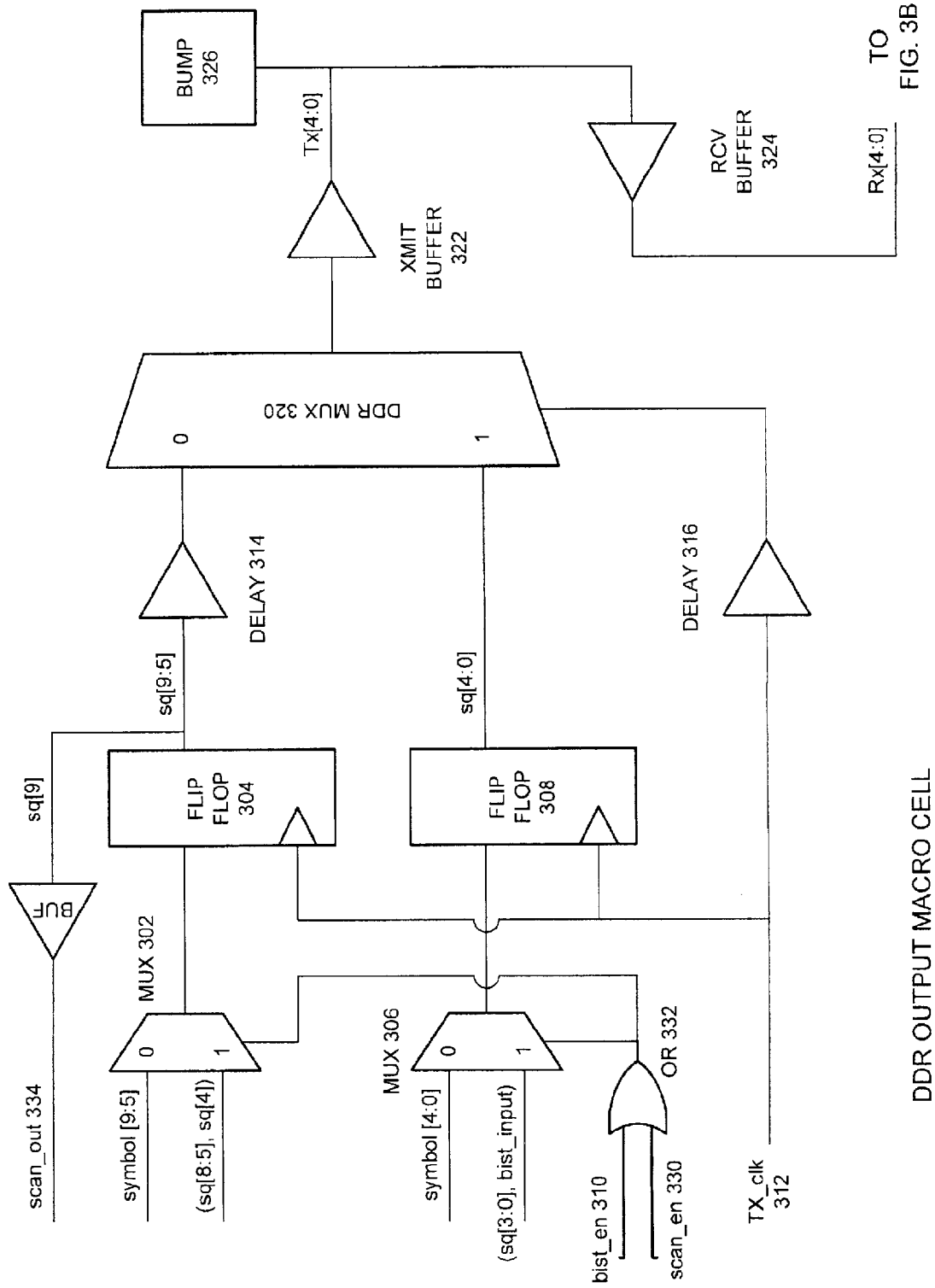
FIGS. 3A–B depict an alternative self-testable DDR output macro cell having scan chain hookup, in accordance with an alternative embodiment of the present invention.
Figure 3B:
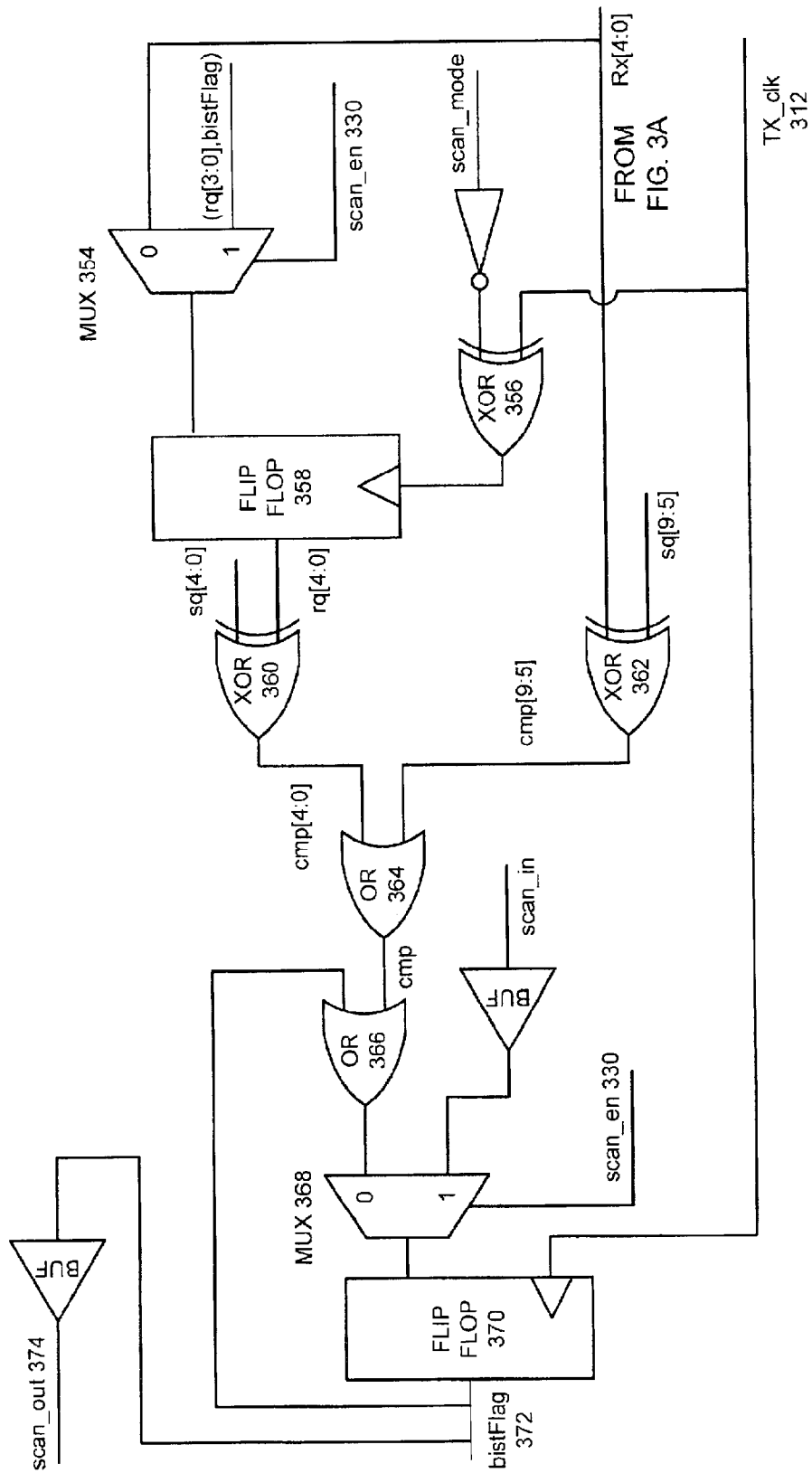
Figure 4:
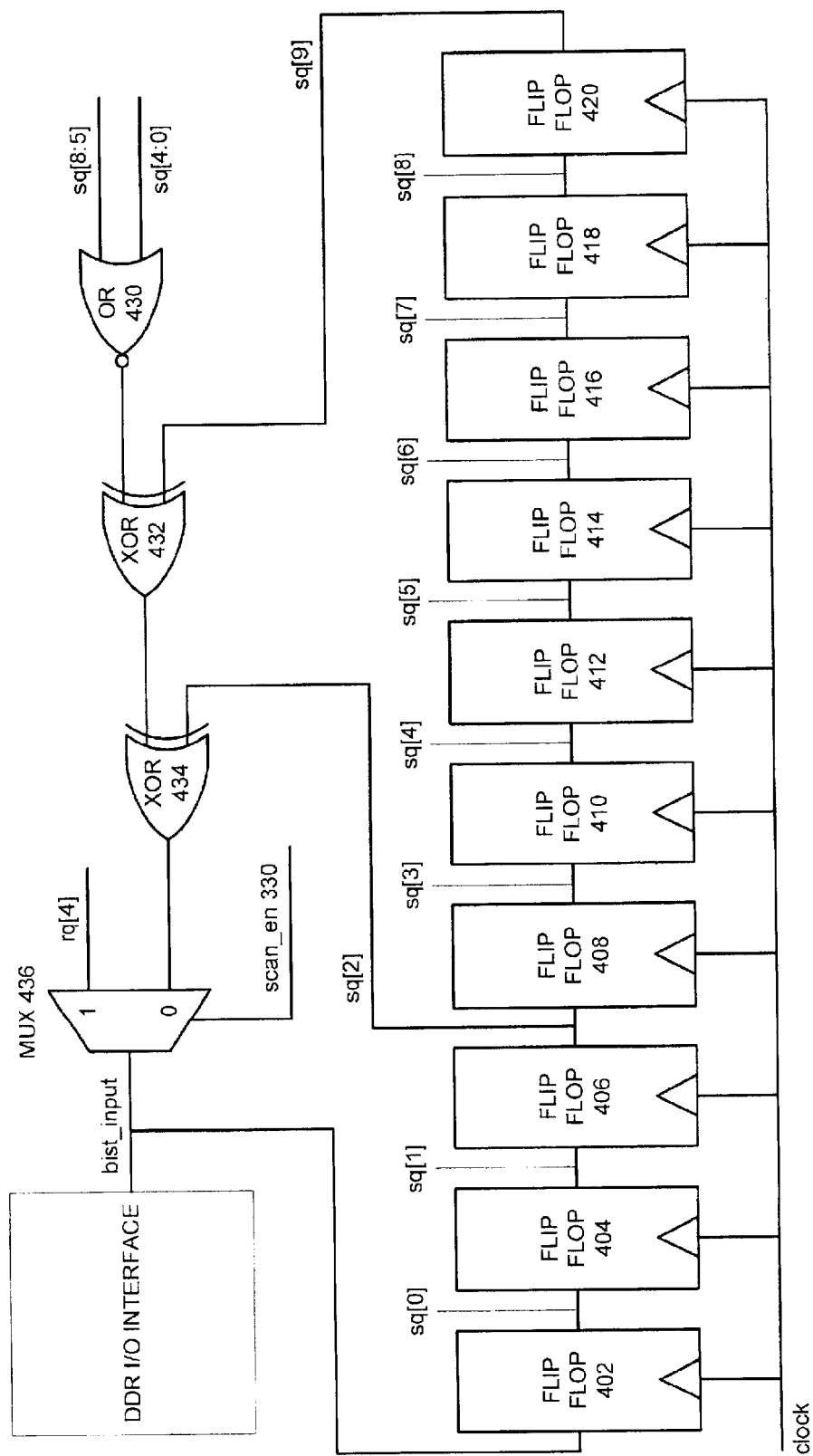
FIG. 4 demonstrates an alternative linear feedback shift register for generating test signals, in accordance with an embodiment of the present invention.

In the embodiment of FIGS. 1A–B, macro 100 is a hard macro and includes appropriate I/O buffers. A DDR macro also, however, may be augmented with scanning logic. FIGS. 3A–B depict DDR output macro cell 300 having scan chain hookup in an alternative embodiment of the invention. FIG. 3A demonstrates DDR output logic; FIG. 3B depicts corresponding evaluation and result logic; FIG. 4 illustrates a modified stimulus generator (e.g., an LFSR) for use with macro cell 300.

DDR Transmit Clock Macro Cell

Figure 5B:
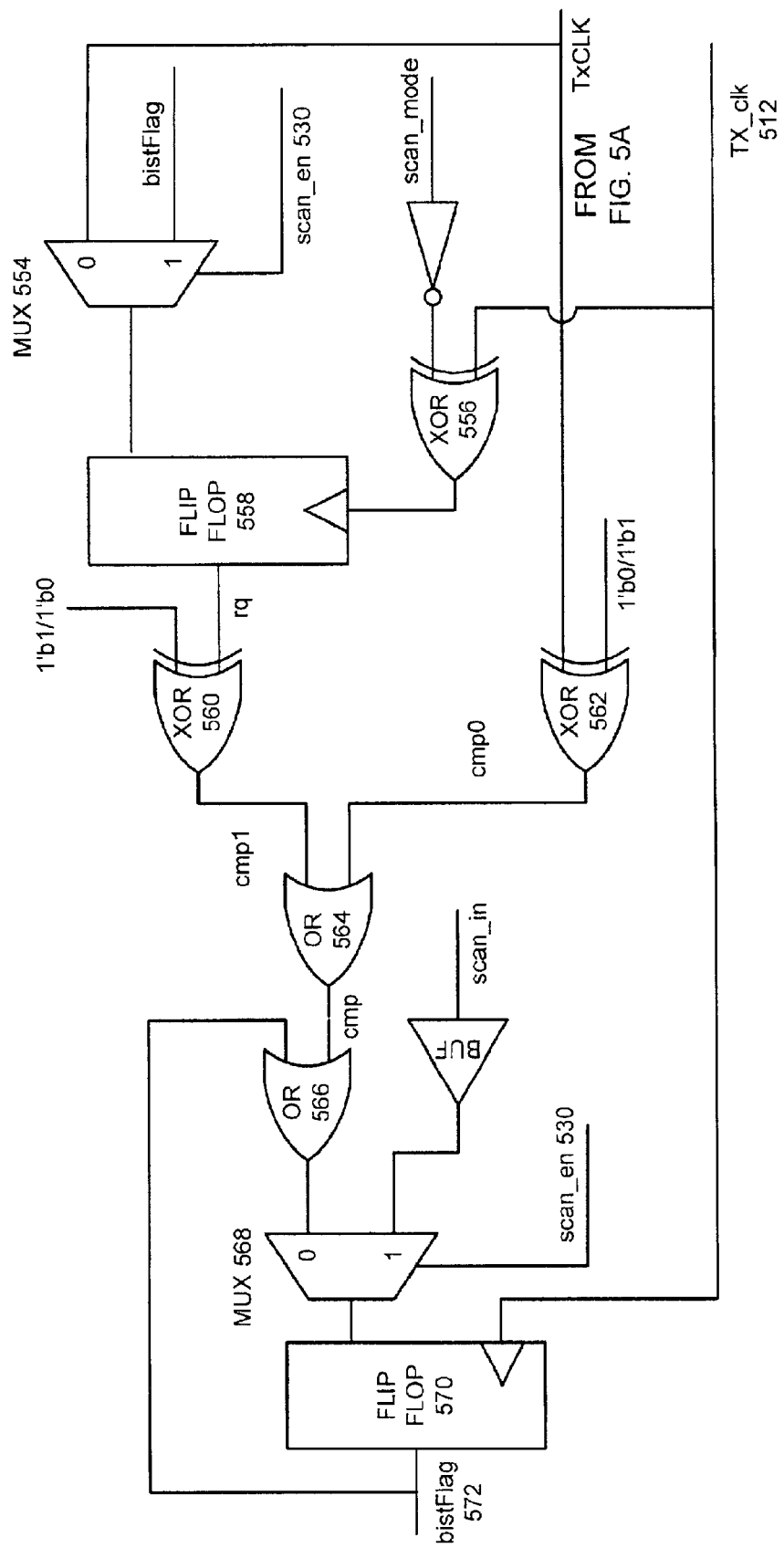

In one embodiment of the invention, the transmit clock circuitry of a DDR I/O interface is also self-testable. FIGS. 5A–B demonstrate one suitable clock output macro cell for this embodiment. Scanning logic is included in the illustrated clock output macro cell, as described above for DDR output macro cell 300.

Clock output macro cell 500 of FIGS. 5A–B is configured similarly to DDR output macro cell 100 of FIGS. 1A–B. However, the illustrative cell is designed for testing clock signals, and a stimulus generator such as LFSR 200 of FIG. 2 is unnecessary because each set of DDR signals is accompanied by just one clock. Instead of a DDR test signal being fed through the DDR I/O interface, the signal being processed by clock output macro cell 500 is a clock signal. As with DDR output macro cell 100, the clock signal is compared with the form generated to support transmission of DDR data, and a result is generated to indicate any errors.

In the embodiment of FIGS. 5A–B, only one clock signal is employed for each set of DDR output signals. Thus, if implemented for DDR output cell 100 of FIGS. 1A–B, flip-flop 504 could operate similar to the five flip-flops represented by flip-flop 104 (FIG. 1A), while flip-flop 508 operates like the five flip-flops represented by flip-flop 108. The inputs to flip-flops 504, 508 are tied to one or zero to produce pulses that are source synchronous to the DDR output cell data.

TxCLK comprises one clock signal for each five bits of data produced by DDR output macro cell 100 (e.g., Tx[4:0] in FIG. 1A) and the two signals are delay matched for source synchronous operation. Also, to allow for differential clocking, the input of multiplexers 502, 506 are shown with appropriate connections (e.g., 1'b0, 1'b1), and two clock macros may be implemented to produce differential clock signals.

When implemented with a DDR output cell such as macro cell 100, the delay (TX_clk 512 to bump 526) of clock output macro cell 500 may be matched to the delay (TX_clk 112 through SD of DDR multiplexer 120 to bump 126) of DDR output macro cell 100.

DDR Data Receive Macro Cell

Figure 6A:
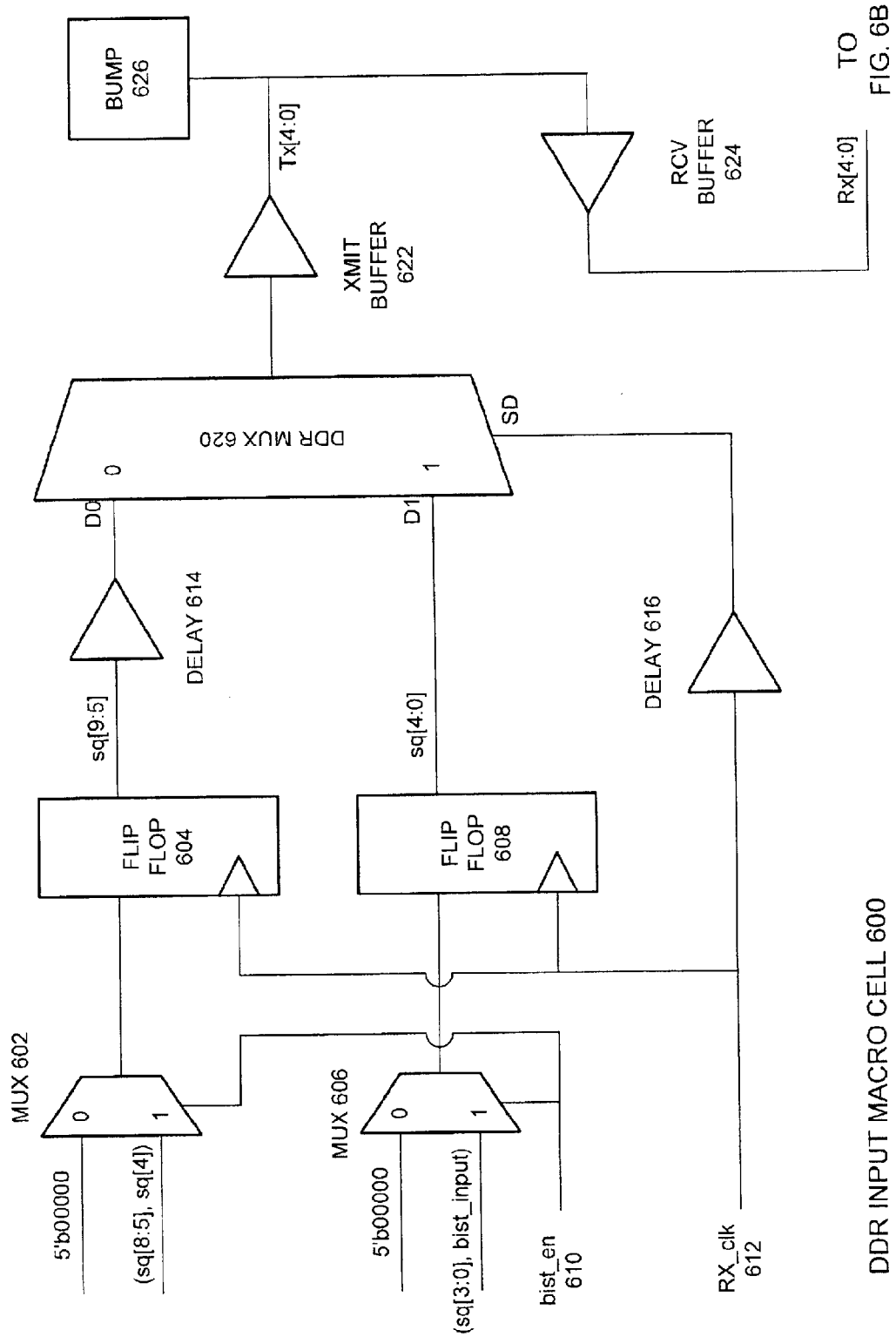
FIGS. 6A–B depict a self-testable DDR input macro cell, in accordance with an embodiment of the invention.
Figure 6B:
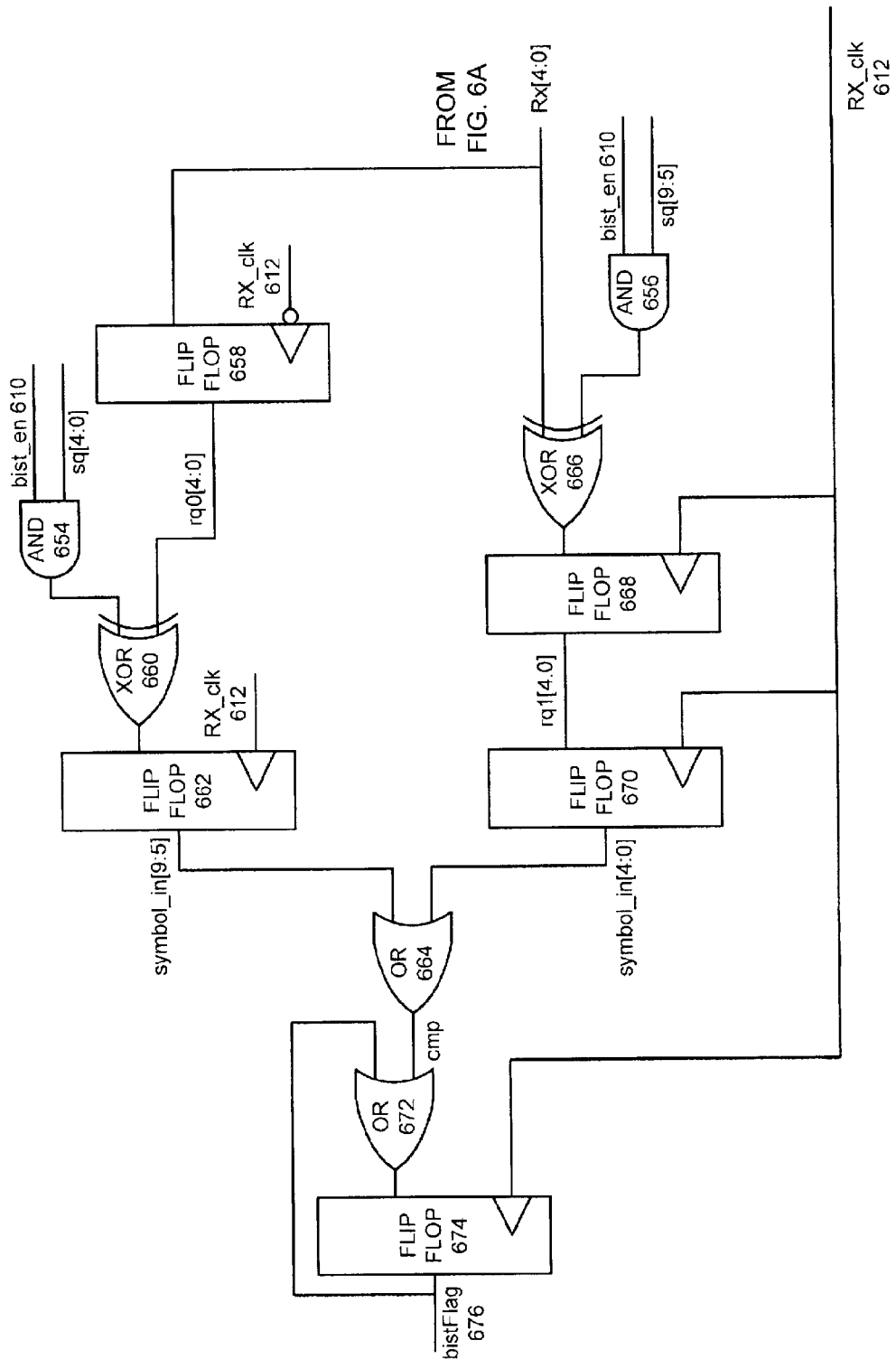

In one embodiment of the invention, a self-testing DDR input macro cell is provided. FIGS. 6A–B depict DDR input macro cell 600 according to this embodiment, which is compatible with output macro cell 100 of FIGS. 1A–B. In the illustrated macro, DDR test patterns may be generated with a suitable stimulus generator, such as LFSR 300 of FIG. 3. The output logic of FIG. 6A produces a DDR signal that is received at the input logic of FIG. 6B through receive buffer 124. Transmit buffer 122, receive buffer 124 and bump 126 may comprise HSTL BIDI (bidirectional high-speed transceiver logic).

As illustrated in FIG. 6B, during BIST the lower five bits ([4:0]) of the DDR test signal are clocked into input registers (e.g., represented by flip-flop 658) on the negative edge of the receive clock, while the upper five bits ([9:5]) of the test signal are received at XOR gate 666 on the positive edge. In a normal operating mode (i.e., BIST is inactive), the upper five bits of data are clocked into flip-flop 658 on the negative edge and the lower five are received at XOR gate 666 on the positive edge.

In this embodiment, the clock and data paths are matched in delay so that the clock edge is positioned at the middle of each data bit. For example, if a 250 MHz clock is used, the clock may arrive at the input with a 90 degree phase shift, which translates into a 1.0 nanosecond delay. In addition, all clock and data transition rates and delays may be configured identically and symmetrically to avoid adding jitter and corrupting the data.

During BIST, AND gate 654 enables comparison of the lower-order bits (qualified through flip-flop 658) at XOR gate 660. Similarly, AND gate 656 enables comparison of the higher-order bits at XOR gate 666. In their normal mode of operation (e.g., BIST is inactive), XOR gates 660, 666 will receive and forward incoming data.

When BIST is active, flip-flops 662, 670 allow the incoming result signals to be synchronized (on the positive edge of RX_clk 612). Symbol_in should comprise zeros unless the evaluation logic of FIG. 6B detects an error. OR gates 664, 672 feed comparison signals to flip-flop 674, which raises bistFlag 676 in the event of an error.

In input macro cell 600, the delay from bump 126 to flip-flop 658 and to flip-flop 668 may be matched to the delay from bump 126 to the receive clock of the operative clock input cell.

One skilled in the art will appreciate various similarities between output macro cell 100, clock macro cell 300 and input macro cell 600. In particular, much of the illustrated logic is replicated between the various cells, thereby demonstrating the flexibility of the BIST logic and methods described herein.

DDR Receive Clock Macro Cell

Figure 7:
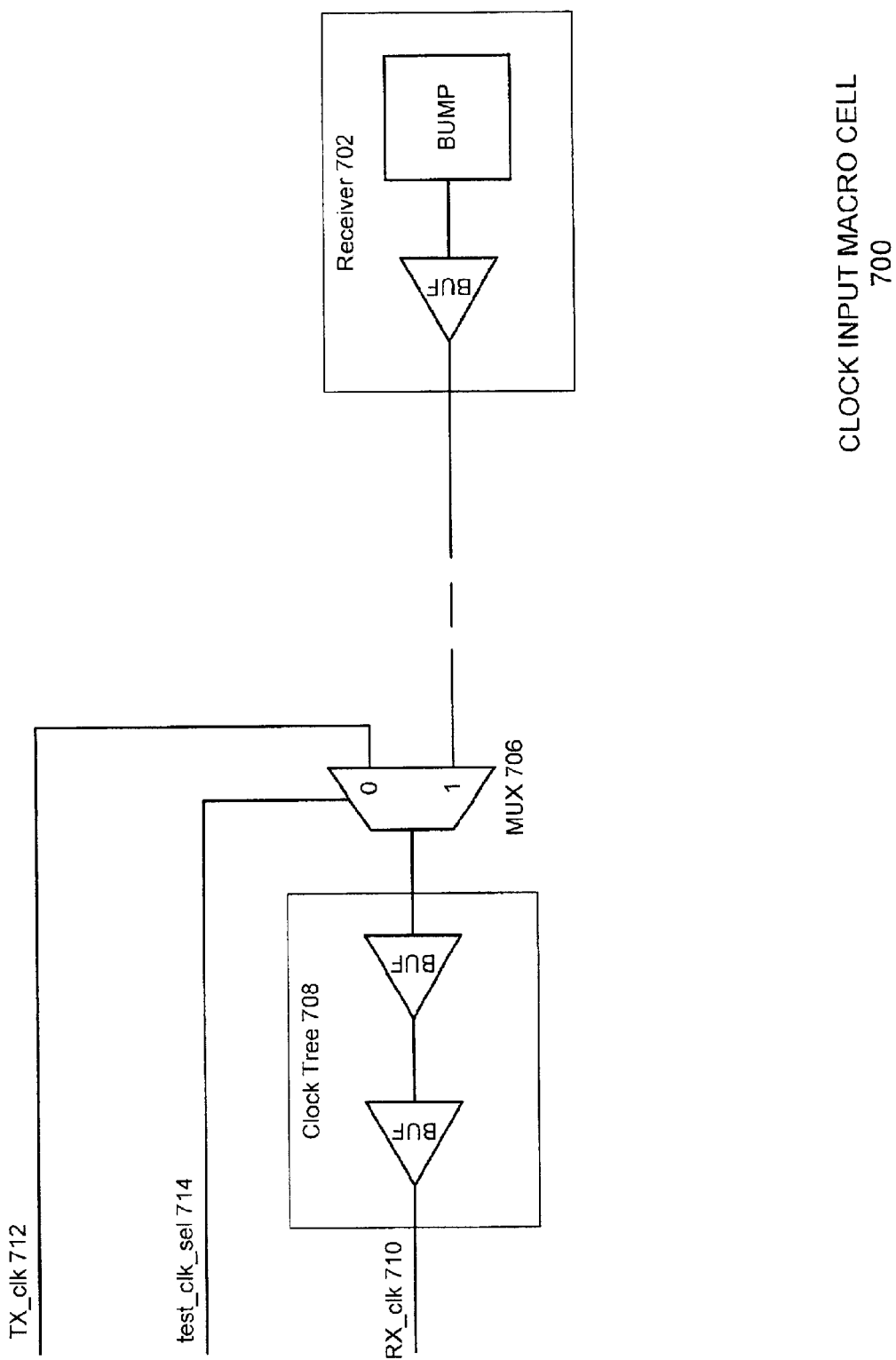
FIG. 7 demonstrates a clock input macro cell configured for use with the DDR input macro cell of FIGS. 6A–B.

FIG. 7 demonstrates an illustrative clock input macro cell according to one embodiment of the invention. Clock macro cell 700 of FIG. 7 is compatible with DDR input macro cell 600 of FIGS. 6A–B.

Receiver 702 may comprise high-speed transceiver logic and may include bi-directionality in an alternative embodiment of the invention. In a normal mode of operation (i.e., BIST is inactive), once clock signal is received for every set of received data. Thus, if clock macro cell 700 were used with DDR input macro cell 600 of FIGS. 6A–B, each clock signal would accompany 5 lines of input. During BIST, however, a clock that is internal to the I/O interface chip may be sent to the clock macro cell to facilitate testing, in which case the receive clock may match the transmit clock.

Thus, as shown in FIG. 7, test_clk_sel 714 may be raised during normal operation, thereby allowing a clock from the bump to be used to clock in the receive data during normal mode. Otherwise, when test_clk_sel 714 is low (e.g., during BIST), TX_clk 712 is fed through clock tree 708.

In one embodiment of the invention, clock input may be differential (e.g., two ½ frequency clocks, one of them being 180 degrees out of phase with the other). In another embodiment, a single clock operating at full frequency may be employed. In one particular embodiment of the invention, during BIST one clock may be used for both transmit and receive testing. In this embodiment transmit and receive clocks may be balanced or lock-up latches may be used when a scan chain transitions from a transmit macro to a receive macro (or vice-versa).

I/O BIST Controller

Figure 8:
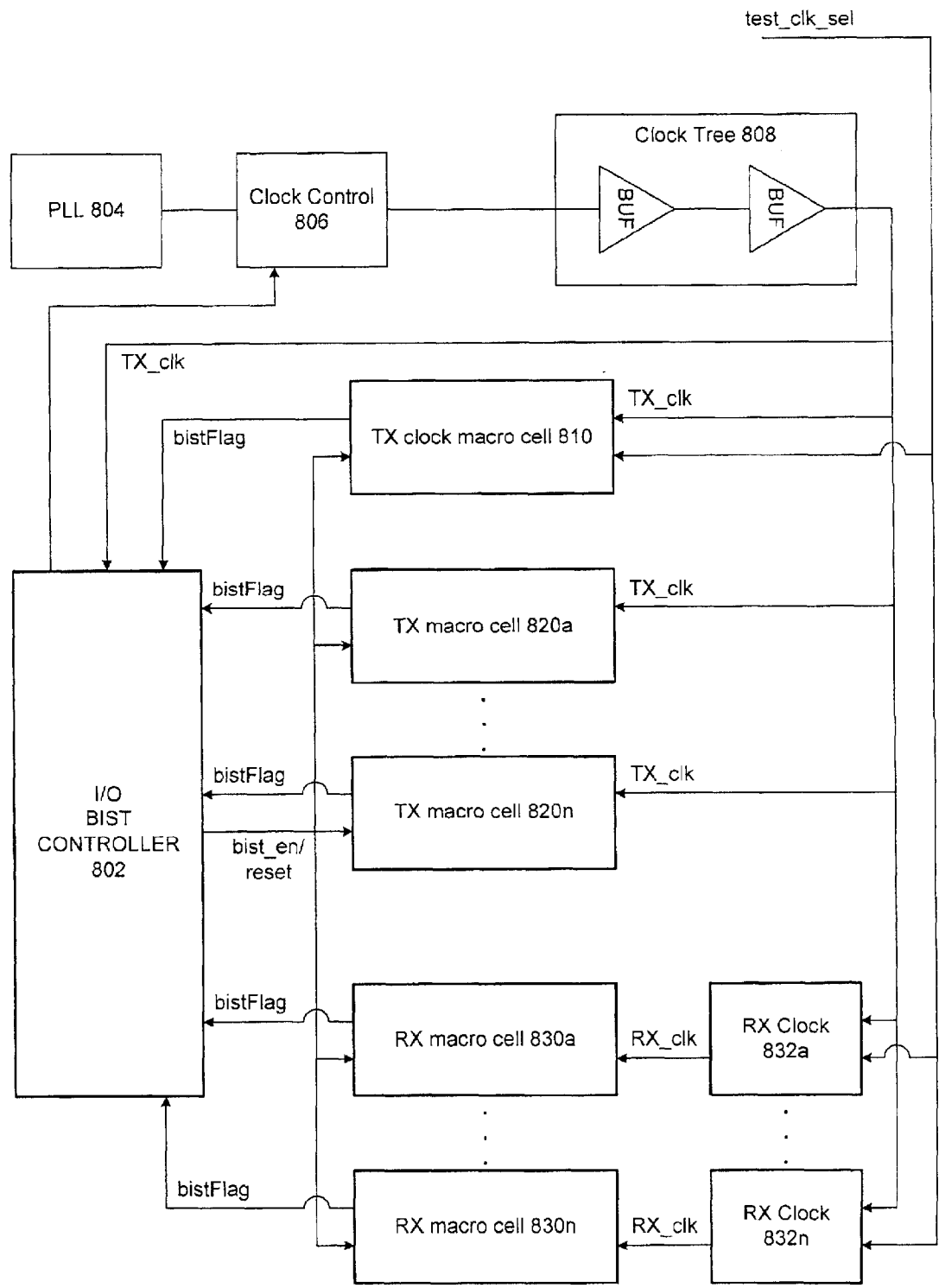
FIG. 8 is a block diagram depicting an I/O BIST controller for controlling the self-testing of DDR input/output and clock macro cells in an embodiment of the invention.

In an embodiment of the invention in which DDR input, DDR output and clock macro cells are combined within a DDR I/O interface, a BIST controller is provided for running the built-in self-tests. FIG. 8 demonstrates one such controller and corresponding macro cells. The self-testing of the various macro cells is performed at speed. However, the initiation of self-tests and/or the reading of results or errors need not be performed at speed.

In FIG. 8, I/O BIST controller 802 drives the input/output at its operating frequency. DDR transmit macro cells 820a–820n and DDR receive macro cells 830a–830n generate test patterns, compare them with what the I/O interface produces in response to the patterns and return a result signal (e.g., bistFlag). Although multiple transmit and receive macro cells are depicted in FIG. 8, in an alternative embodiment of the invention only one of each type of macro cell is necessary.

Further, each macro cell may be of virtually any size. For example, in the illustrated embodiment of the invention, a transmit macro cell of FIG. 8 may comprise or be derived from DDR output macro cell 100 of FIGS. 1A–B, while a receive macro cell of FIG. 8 may comprise or be derived from DDR input macro cell 600 of FIGS. 6A–B. Thus, each transmit and macro cell may be configured for five bits of DDR input/output and therefore contain a set of five flip-flops. If a wider interface is desired, such as 64 bits, then multiple (e.g., thirteen) transmit and receive macro cells may be employed.

A single clock is produced on-chip, with PLL 804, for BIST. This clock is used to drive the DDR input and output macros as well as the clock macros.

The foregoing descriptions of embodiments of the invention have been presented for purposes of illustration and description only. They are not intended to be exhaustive or to limit the invention to the forms disclosed. Accordingly, the above disclosure is not intended to limit the invention; the scope of the invention is defined by the appended claims.

What is claimed is:

1. A self-testable double data rate (DDR) circuit, comprising:
    a stimulus generator configured to generate a test DDR signal for testing an input/output interface of a DDR circuit;
    an evaluator configured to compare said test DDR signal with a response signal produced by the input/output interface of the DDR circuit in response to said test DDR signal; and
    a result generator configured to generate an error condition if said response signal does not have a predetermined relationship to said test DDR signal.

2. The self-testable DDR circuit of claim 1, wherein said stimulus generator, said evaluator and said result generator are located on a single semiconductor chip.

3. The self-testable DDR circuit of claim 2, wherein self-testing of said self-testable DDR circuit is performed without said test DDR signal or said response signal crossing a boundary of the semiconductor chip, thereby allowing said self-testing to be performed at an on-chip clock speed.

4. The self-testable DDR circuit of claim 1, wherein said stimulus generator comprises a linear feedback shift register.

5. The self-testable DDR circuit of claim 1, wherein said test DDR signal is generated and evaluated during a self-testing mode of operation controlled by a built-in self-test controller.

6. The self-testable DDR circuit of claim 5, wherein said response signal is produced by the DDR circuit at the same data rate as the DDR circuit operates during a normal mode of operation.

7. The self-testable DDR circuit of claim 1, wherein said evaluator is configured to perform said comparison dynamically as said response signal is generated.

8. The self-testable DDR circuit of claim 1, wherein said result generator is configured to maintain said error condition during generation and evaluation of a subsequent test DDR signal.

9. A double data rate (DDR) macro cell for a self-testable input/output interface, the macro cell comprising:
    a signal generator configured to generate an input signal pattern for testing the input/output interface;
    an evaluator configured to compare said input signal pattern with an output pattern produced by the input/output interface in response to said input signal pattern; and
    a result generator configured to indicate an error if said output signal pattern differs from said input signal pattern;
    wherein said signal generator, said evaluator and said result generator are located on a single semiconductor chip; and
    wherein the input/output interface is an external interface configured to couple the single semiconductor chip to an external circuit.

10. The DDR macro cell of claim 9, wherein testing of the input/output interface is performed without said input signal pattern or said output signal pattern crossing a boundary of the semiconductor chip, thereby allowing said testing to be performed at an on-chip clock speed.

11. The DDR macro cell of claim 9, wherein said signal generator comprises a linear feedback shift register.

12. The DDR macro cell of claim 11, wherein said linear feedback shift register has a characteristic polynomial of $x^{10}+x^3+1$.

13. The DDR macro cell of claim 9, wherein said evaluator performs said comparison in real-time as the input/output interface produces said output pattern.

14. The DDR macro cell of claim 9, wherein the input/output interface produces data in DDR form at a first data rate in a normal operating mode and produces said output pattern at said first data rate in a self-testing mode.

15. The DDR macro cell of claim 9, wherein the DDR macro cell is a DDR data output macro cell.

16. The DDR macro cell of claim 9, wherein the DDR macro cell is a DDR data input macro cell.

17. A double data rate (DDR) input/output interface of a first circuit, configured to couple the first circuit to an external circuit, the DDR input/output interface comprising:

a self-testable output macro cell;

a self-testable input macro cell; and a self-testable clock macro cell;

wherein self-testing of said output macro cell, said input macro cell and said clock macro cell is performed entirely within the first circuit.

18. The DDR input/output interface of claim 17, further comprising a built-in self-test controller configured to control said self-testing of said output macro cell, said input macro cell and said clock macro cell.

19. The DDR input/output interface of claim 17, wherein said self-testing of each said macro cell is performed at an operational speed of said macro cell.

20. The DDR input/output interface of claim 17, wherein one or more of said output macro cell and said input macro cell comprise:

a signal generator configured to generate a test signal for testing said macro cell;

an evaluator configured to compare said test signal with a response signal produced in response to said test signal; and a result generator configured to indicate an error if said response signal differs from said test signal.

21. The DDR input/output interface of claim 20, wherein said signal generator, said evaluator and said result generator are located on a single semiconductor chip.

22. The DDR input/output interface of claim 21, wherein testing of said DDR input/output interface is performed without said test signal or said response signal crossing a boundary of the semiconductor chip, thereby allowing said testing to be performed at an on-chip clock speed.

23. The self-testable DDR circuit of claim 1, wherein:

said self-testable DDR circuit is a single circuit; and self-testing of said self-testable DDR circuit is performed without activating an external circuit.

24. A double data rate (DDR) circuit for self-testing an external input/output interface of the circuit, the circuit comprising:

an input/output interface configured for coupling to an external circuit;

a set of DDR output macro cells;

a set of DDR input macro cells;

a set of clock macro cells;

a clock; and a controller for controlling self-testing of the external input/output interface of the DDR circuit, using the DDR output macro cells, DDR input macro cells and clock macro cells, and without communicating with any external circuit.

25. The DDR circuit of claim 24, wherein said DDR output macro cells comprise scan chain hookups to facilitate scanning.

* * * * *